(12) United States Patent
Kim et al.

(10) Patent No.: US 11,894,242 B2
(45) Date of Patent: Feb. 6, 2024

(54) SEMICONDUCTOR PACKAGE AND METHOD OF MANUFACTURING SEMICONDUCTOR PACKAGE

(71) Applicant: SAMSUNG ELECTRONICS CO., LTD., Suwon-si (KR)

(72) Inventors: Taeyoung Kim, Suwon-si (KR); Seokhong Kwon, Hwaseong-si (KR); Wonyoung Kim, Seoul (KR); Jinchan Ahn, Hwaseong-si (KR)

(73) Assignee: SAMSUNG ELECTRONICS CO, LTD., Suwon-si (KR)

( * ) Notice: Subject to any disclaimer, the term of this patent is extended or adjusted under 35 U.S.C. 154(b) by 0 days.

(21) Appl. No.: 18/174,576

(22) Filed: Feb. 24, 2023

(65) Prior Publication Data
US 2023/0223279 A1 Jul. 13, 2023

Related U.S. Application Data

(63) Continuation of application No. 17/212,364, filed on Mar. 25, 2021, now Pat. No. 11,610,786.

(30) Foreign Application Priority Data

Jun. 24, 2020 (KR) .................. 10-2020-0077095

(51) Int. Cl.
| | | |
|---|---|---|
| *H01L 23/48* | (2006.01) | |
| *H01L 21/56* | (2006.01) | |
| *H01L 23/24* | (2006.01) | |
| *H01L 23/00* | (2006.01) | |

(52) U.S. Cl.
CPC ............ *H01L 21/565* (2013.01); *H01L 23/24* (2013.01); *H01L 21/561* (2013.01); *H01L 24/16* (2013.01); *H01L 24/48* (2013.01); *H01L 24/73* (2013.01); *H01L 2224/16227* (2013.01); *H01L 2224/48227* (2013.01); *H01L 2224/73204* (2013.01); *H01L 2224/73265* (2013.01)

(58) Field of Classification Search
CPC .. H01L 21/565; H01L 23/28; H01L 2924/181
USPC .......................................... 257/737; 438/127
See application file for complete search history.

(56) References Cited

U.S. PATENT DOCUMENTS

| | | | |
|---|---|---|---|
| 5,793,118 A | 8/1998 | Nakajima | |
| 5,953,589 A | 9/1999 | Shim et al. | |
| 5,977,626 A | 11/1999 | Wang et al. | |
| 6,111,306 A * | 8/2000 | Kawahara | H01L 21/568 257/668 |
| 6,982,042 B2 | 1/2006 | Church et al. | |
| 7,223,673 B2 | 5/2007 | Wang et al. | |
| 7,554,182 B2 * | 6/2009 | Shirasaka | H01L 21/565 257/676 |
| 7,811,063 B2 * | 10/2010 | Bonnet | F03D 1/0675 416/500 |
| 7,898,093 B1 | 3/2011 | Darveaux et al. | |

(Continued)

*Primary Examiner* — Nitin Parekh
(74) *Attorney, Agent, or Firm* — F. CHAU & ASSOCIATES, LLC

(57) ABSTRACT

A semiconductor package includes a package substrate, at least one semiconductor chip mounted on the package substrate, a molding member on the package substrate to cover at least a portion of the semiconductor chip, and a mechanical reinforcing member provided around the semiconductor chip within the molding member and extending in at least one direction.

20 Claims, 12 Drawing Sheets

(56) References Cited

U.S. PATENT DOCUMENTS

| | | |
|---|---|---|
| 8,742,594 B2 | 6/2014 | Daubenspeck et al. |
| 8,779,599 B2 | 7/2014 | Lin et al. |
| 8,791,562 B2 | 7/2014 | Lee et al. |
| 9,536,842 B2 | 1/2017 | Bao et al. |
| 9,768,129 B2 | 9/2017 | Lee et al. |
| 2002/0015607 A1* | 2/2002 | Matich ............... B41J 2/17553 400/191 |
| 2005/0257707 A1* | 11/2005 | Re ........................ B41F 13/10 101/376 |
| 2006/0255471 A1 | 11/2006 | Lee et al. |
| 2009/0289339 A1 | 11/2009 | Hu et al. |
| 2012/0235308 A1* | 9/2012 | Takahashi ............. H01L 24/97 438/109 |
| 2013/0119549 A1* | 5/2013 | Cheng ................... B29C 39/10 257/772 |
| 2014/0288220 A1 | 9/2014 | Duncan et al. |
| 2017/0194268 A1 | 7/2017 | Ho et al. |
| 2020/0020606 A1 | 1/2020 | Kim et al. |
| 2020/0058551 A1 | 2/2020 | Bae et al. |

\* cited by examiner

SEMICONDUCTOR PACKAGE AND METHOD OF MANUFACTURING SEMICONDUCTOR PACKAGE

CROSS REFERENCE TO RELATED APPLICATIONS

This application is a continuation application of U.S. application Ser. No. 17/212,364, filed on Mar. 25, 2021, which claims priority under 35 U.S.C. § 119 to Korean Patent Application No. 10-2020-0077095, filed on Jun. 24, 2020 in the Korean Intellectual Property Office (KIPO), the contents of which are herein incorporated by reference in their entirety.

TECHNICAL FIELD

Example embodiments relate to a semiconductors, and more particularly, to a semiconductor package and method of manufacturing a semiconductor package.

DISCUSSION OF RELATED ART

According to the trend of miniaturization of various electronic products using semiconductor devices, semiconductor packages are becoming smaller, thinner, and lighter. Thus, cracks may easily occur in the semiconductor package due to external impact. In particular, in the automotive field, package cracks due to mechanical damage may cause personal injury. Additionally, thermal expansion and contraction and may case cracks in some semiconductor packages.

SUMMARY

According to example embodiments, a semiconductor package includes, a package substrate, at least one semiconductor chip mounted on the package substrate, a molding member on the package substrate to cover at least a portion of the semiconductor chip, and a mechanical reinforcing member provided around the semiconductor chip within the molding member and extending in at least one direction.

According to example embodiments, a semiconductor package includes, a package substrate having an upper surface and a lower surface opposite to each other, at least one semiconductor chip mounted on the upper surface of the package substrate, a molding member on the upper surface of the package substrate to cover at least a portion of the semiconductor chip, and a reinforcing member provided in at least a portion of the molding member and extending around the semiconductor chip.

According to example embodiments, in a method of manufacturing a semiconductor package, a semiconductor chip is arranged on a substrate. The substrate is disposed in a cavity between a lower mold and an upper mold of a molding apparatus. A mechanical reinforcing pattern is positioned around the semiconductor chip within the cavity. A molding material is injected into the cavity and cured.

According to example embodiments, a semiconductor package may include a mechanical reinforcing pattern within a molding member which covers a semiconductor chip provided on a package substrate. The mechanical reinforcing pattern may extend in at least one direction around the semiconductor chip within the molding member. The mechanical reinforcing pattern may include a material different from the molding member to serve as a mechanical reinforcing member to improve mechanical properties of the semiconductor package. A material, physical properties, and a size of the reinforcing pattern may be selected to prevent cracks and improve mechanical properties of the semiconductor package.

BRIEF DESCRIPTION OF THE DRAWINGS

Example embodiments will be more clearly understood from the following detailed description when considered in connection with the accompanying drawings.

FIG. 1 is a plan view illustrating a semiconductor package in accordance with example embodiments.

FIG. 2 is a cross-sectional view taken along the line A-A' in FIG. 1.

FIG. 3 is a cross-sectional view taken along the line B-B' in FIG. 1.

FIGS. 4 to 7 are cross-sectional views illustrating a method of manufacturing a semiconductor package in accordance with example embodiments.

FIGS. 8 to 10 are plan views illustrating a reinforcing member in accordance with example embodiments.

FIG. 11 is a plan view illustrating a semiconductor package in accordance with example embodiments.

FIG. 12 is a cross-sectional view taken along the line C-C' in FIG. 11.

FIGS. 13 and 14 are cross-sectional views illustrating a method of manufacturing a semiconductor package in accordance with example embodiments.

DETAILED DESCRIPTION OF EXAMPLE EMBODIMENTS

Hereinafter, example embodiments will be described in detail with reference to the accompanying drawings.

Figure 1:
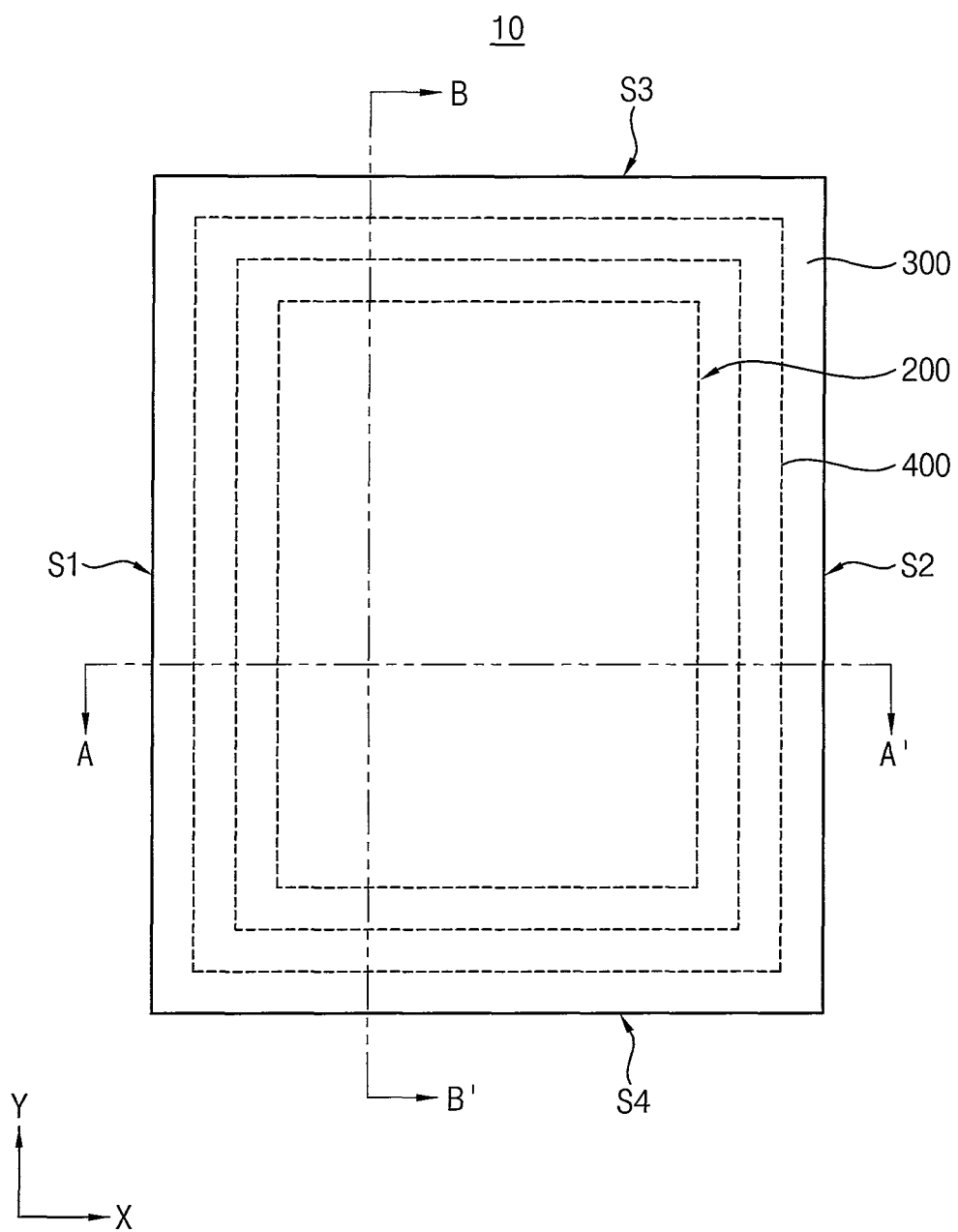
FIGS. 1 to 14 represent non-limiting, example embodiments as described herein.
Figure 2:
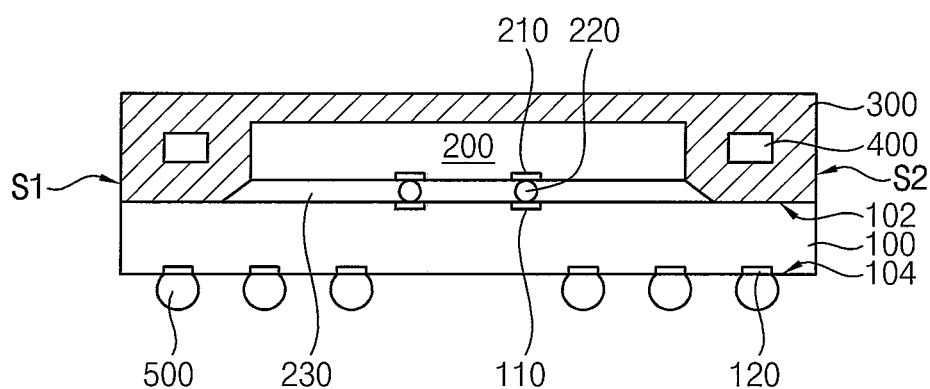
Figure 3:
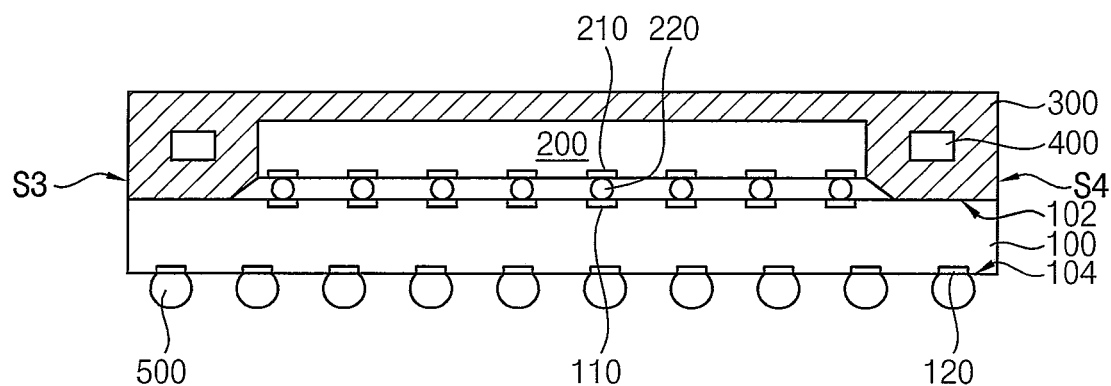

FIG. 1 is a plan view illustrating a semiconductor package in accordance with example embodiments. FIG. 2 is a cross-sectional view taken along the line A-A' in FIG. 1. FIG. 3 is a cross-sectional view taken along the line B-B' in FIG. 1.

Referring to FIGS. 1 to 3, a semiconductor package 10 may include a package substrate 100, at least one semiconductor chip 200 arranged on an upper surface 102 of the package substrate 100, a molding member 300 on the upper surface 102 of the package substrate 100 to cover at least a portion of the semiconductor chip 200, and a reinforcing member extending in at least one direction within the molding member 300. The semiconductor package 10 may further include outer connection members 500 disposed on a lower surface 104 of the package substrate 100.

In example embodiments, the package substrate 100 may be a substrate having the upper surface 102 and the lower surface 104 opposite to each other. For example, the package substrate 100 may be a printed circuit board (PCB). The PCB may be a multilayered circuit board, and may include vias and various circuits therein.

The package substrate 100 may have a rectangular shape. The package substrate 100 may have a chip mounting region and a peripheral region surrounding the chip mounting region. The semiconductor chip 200 may be disposed on the upper surface 102 of the package substrate 100. The semiconductor chip 200 may be mounted on the chip mounting region and have a footprint (e.g., an area from a top down view) matching or similar to the area of the chip mounting region.

A plurality of substrate pads 110 may be provided on the upper surface 102 of the package substrate 100. The substrate pads 110 may be arranged within the chip mounting region. At least a portion of the substrate pad 110 may be used as a connection pad for electrical connection with the semiconductor chip 200.

A first insulation layer may be provided on the upper surface 102 of the package substrate 100. The first insulation layer may cover the entire upper surface 102 of the package substrate except for at least a portion of the substrate pad 110. The first insulation layer may expose a portion of the substrate pad 110. In some examples, the first insulation layer may expose one or more substrate pads 110 to a portion of the substrate 100. In some examples, the first insulation layer may include solder resist, silicon oxide, silicon nitride, silicon oxynitride, etc.

In example embodiments, the semiconductor chip 200 may have a plurality of chip pads 210 on a first surface, that is, active surface thereof. The semiconductor chip 200 may be mounted on the package substrate 100 such that the first surface on which the chip pads 210 are formed faces the package substrate 100.

In some embodiments, semiconductor chip 200 may be mounted on the package substrate 100 in a flip chip bonding manner. The semiconductor chip 200 may be mounted on the package substrate 100 via conductive bumps 220. The conductive bump 220 may be interposed between the substrate pad 110 of the package substrate 100 and the chip pad 210 of the semiconductor chip 200 to electrically connect the semiconductor chip 200 and the package substrate 100.

A plurality of the conductive bumps 220 may be disposed on the substrate pads 110 respectively. The conductive bumps 220 may be attached on the chip pads 210 of the semiconductor chip 200 respectively. The semiconductor chip 200 may be stacked on the package substrate 100 by disposing the conductive bumps 220 to substrate pads 110, thereby forming an electrical connection to the package substrate 100.

For example, the conductive bump 220 may include a micro bump, a solder bump, a solder ball, etc. The conductive bump 20 may include a metal such as copper (Cu), nickel (Ni), tin (Sn), tin/silver (Sn/Ag), tin/copper (Sn/Cu), tin/indium (Sn/In) or etc.

An underfill member 230 may be provided between the semiconductor chip 200 and the package substrate 100. The underfill member 230 may fill a space between the upper surface 102 of the package substrate 100 and the semiconductor chip 200. The underfill member 230 may include epoxy molding compound (EMC). The underfill member may be formed together with the molding member 300 by a molded underfill (MUF) process. Alternatively, the underfill member may be formed by a process separate from a process of forming the molding member 300.

Although only some substrate pads and chip pads are illustrated in the figures, the number and arrangements of the substrate pads and the chip pads and molding member represent example embodiments of the present disclosure, and the present disclosure is not necessarily limited thereto. Further, although one semiconductor chip is illustrated in the figures, the present disclosure is not necessarily limited thereto, and a plurality of semiconductor chips may be stacked on the package substrate.

In example embodiments, the molding member 300 may be provided on the package substrate 100 to cover at least a portion of the semiconductor chip 200 thereby protecting the semiconductor chip 200 from external impacts. For example, the molding member may include epoxy mold compound (EMC). The molding member 300 may be formed by a molding process, a screen printing process, a lamination process, etc.

The molding member 300 may have a rectangular shape corresponding to the shape of the package substrate 100. The molding member 300 may have a first side surface S1 and a second side surface S2 opposite to each other and extending in a direction parallel with a first direction (Y direction) which is perpendicular to the upper surface 102 of the package substrate 100. The molding member may have a third side surface S3 and a fourth side surface S4 opposite to each other and extending in a direction parallel with a second direction (X direction) which is perpendicular to the first direction.

A length in the first direction (Y direction) of the molding member 300 may be substantially the same as a length in the first direction (Y direction) of the package substrate 100 and may define a longitudinal direction length (L), and a length in the second direction (X direction) of the molding member 300 may be substantially the same as a length in the second direction (X direction) of the package substrate 100 and may define a traverse direction length (W).

In example embodiments, the reinforcing pattern 400 may be provided in at least a portion of the molding member 300 to extend around the semiconductor chip 200. The molding member 300 may cover at least a portion of the reinforcing member 400. Accordingly, an outer surface of the reinforcing member 400 might not be exposed to the outside.

As illustrated in FIG. 1, the reinforcing pattern 400 may have a ring shape extending around the semiconductor chip 200. The reinforcing pattern 400 may be spaced apart from the upper surface 102 of the package substrate 100. The reinforcing pattern 400 may be arranged over a peripheral region of the package substrate 100. The reinforcing pattern 400 may be spaced apart from an outer surface of the semiconductor chip 200.

The reinforcing pattern 400 may include a material different from the molding member 300 to serve as a mechanical reinforcing member to strengthen the semiconductor package 10. For example, the reinforcing pattern 400 may include a metal such as iron (Fe), aluminum (Al), copper (Cu), etc., or a plastic material.

In example embodiments, the molding member 300 may have a first tensile strength, and the reinforcing pattern 400 may have a second tensile strength greater than the first tensile strength. Since the reinforcing pattern 400 has a relatively high rigidity, it may be possible to prevent cracks from occurring in the semiconductor package 10.

The molding member 300 may have a first coefficient of thermal expansion, the reinforcing pattern 400 may have a second coefficient of thermal expansion different from the first coefficient of thermal expansion, and the package substrate 100 may have a third coefficient of thermal expansion different from the second coefficient of thermal expansion. The second coefficient of thermal expansion of the reinforcing pattern 400 may be determined to prevent warpage of the semiconductor package. For example, the second coefficient of thermal expansion may be greater than the first coefficient of thermal expansion. Since the reinforcing pattern 400 has a thermal expansion coefficient different from those of the molding member 300 and the package substrate 100, they semiconductor package 10 may be less likely to warp.

The material and physical properties (e.g., strength, coefficient of thermal expansion, elastic modulus, glass transition temperature, etc.) and size (e.g., length, thickness, width, etc.) of the reinforcing pattern 400 may be selected in order to prevent cracks in the semiconductor package 10 and strengthen the mechanical integrity of the package.

In example embodiments, external connection pads 120 may be provided on the lower surface 104 of the package substrate 100, and an electrical signal may be supplied to and from the semiconductor chip 200 through the external connection pads 120. A second insulation layer may be provided on the lower surface 104 of the package substrate 100. The external connection pads 120 may be exposed by the second insulation layer. For example, the second insulation layer may expose external connection pads 120 to external connection members 500. The second insulation layer may include a silicon oxide layer, a silicon nitride layer, a silicon oxynitride layer, etc. External connection members 500 may respectively be disposed on the external connection pads 120 of the package substrate 100 to be electrically connected to an external device. The external connection members 500 may be, for example, solder balls. The semiconductor package 10 may be mounted on a module substrate using the solder balls as a connecting medium to form part of a memory module.

As mentioned above, the semiconductor package 10 may include the mechanical reinforcing pattern 400 within the molding member 300 that covers the semiconductor chip 200 provided on the package substrate 100. The mechanical reinforcing pattern 400 may extend in at least one direction around the semiconductor chip 200 within the molding member 300. The reinforcing pattern 400 may include a material different from the molding member 300 to serve as a mechanical reinforcing member to strengthen the semiconductor package 10. The material, physical properties, and size of the reinforcing pattern may be selected to prevent cracks and increase of the structural integrity of the semiconductor package.

Thus, since the reinforcing pattern 400 has a relatively high rigidity, it may be possible to prevent cracks from occurring in the semiconductor package 10. Further, since the reinforcing pattern 400 has a thermal expansion coefficient different from those of the molding member 300 and the package substrate 100, the semiconductor package 10 may be less likely to warp when exposed to a temperature change.

Hereinafter, a method of manufacturing the semiconductor package in FIG. 1 will be described.

Figure 4:
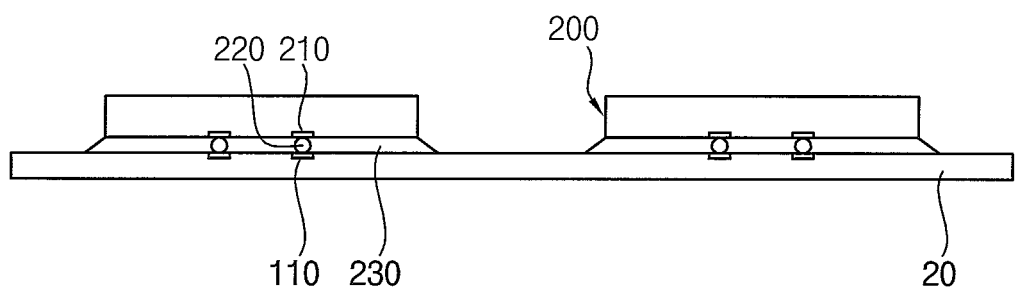
Figure 5:
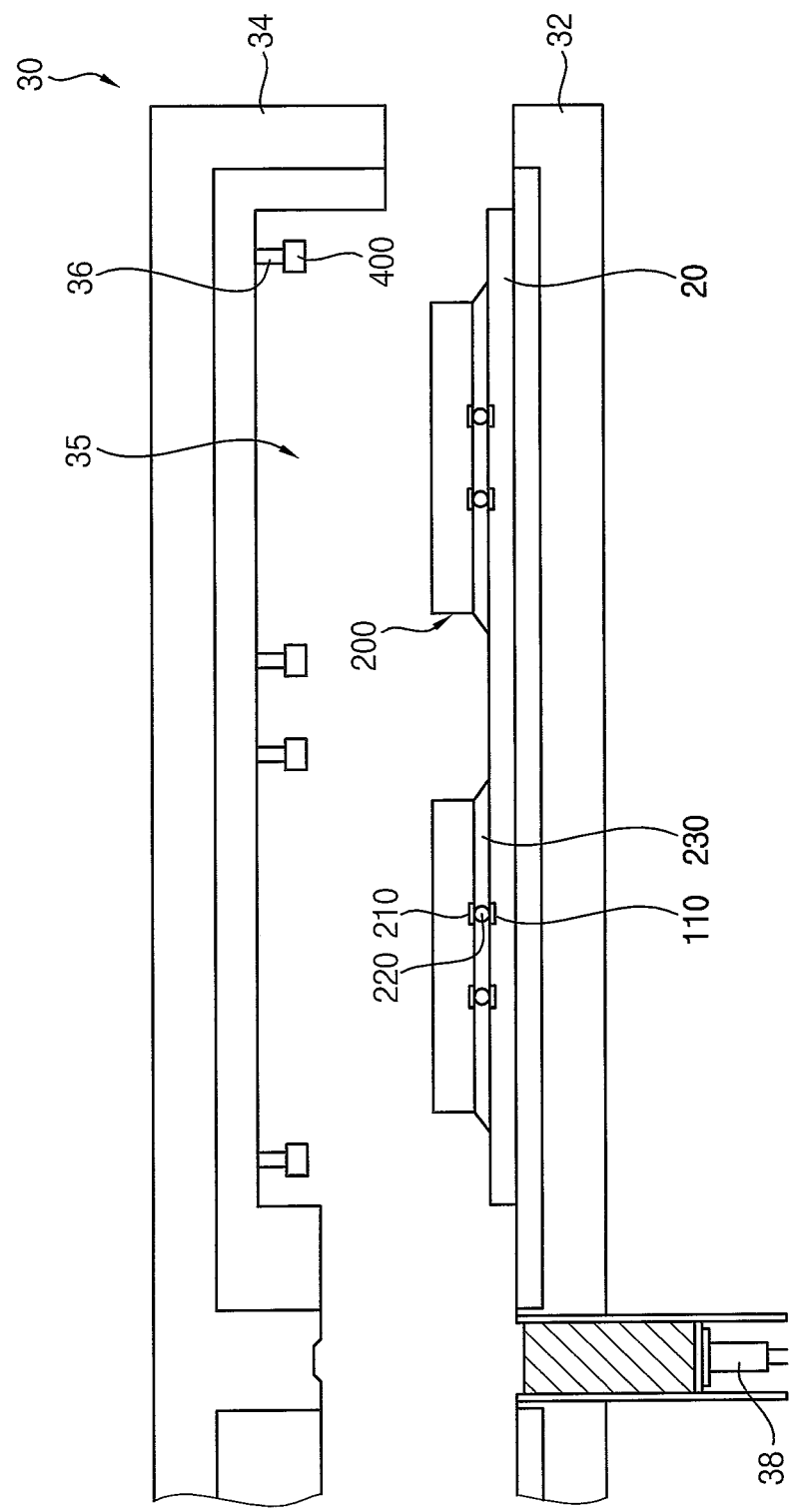
Figure 6:
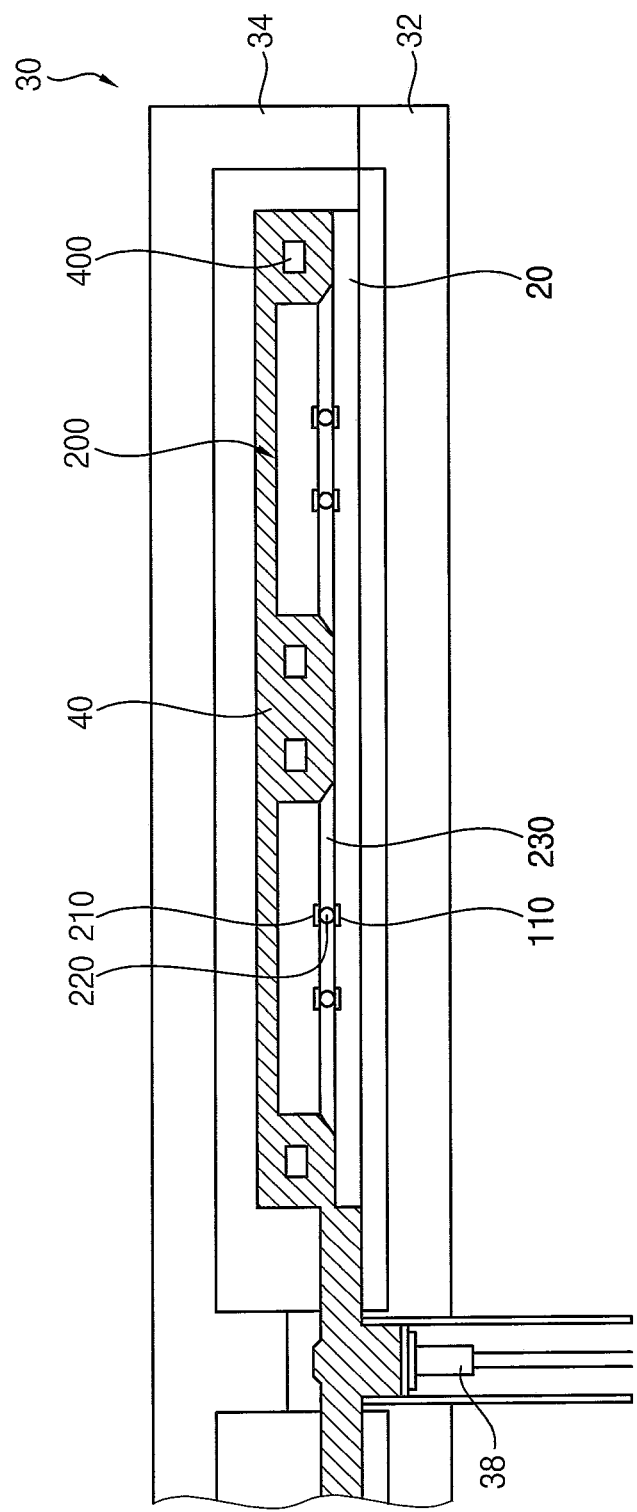

FIGS. 4 to 7 are cross-sectional views illustrating a method of manufacturing a semiconductor package in accordance with example embodiments. FIGS. 5 and 6 are cross-sectional views illustrating a process of encapsulating a semiconductor chip using a molding apparatus.

Referring to FIG. 4, a plurality of semiconductor chips 200 may be arranged on a substrate 20.

In example embodiments, the semiconductor chips 200 may be mounted on the substrate 20 by a flip chip bonding process.

In particular, after forming conductive bumps 220 on chip pads 210 on a first surface of each semiconductor chip 200, the semiconductor chips 200 may be mounted on the substrate 20 using the conductive bumps 220 as a connecting medium and may be arranged in a matrix form. The conductive bumps 220 may be disposed on connection pads, e.g., substrate pads 110 of the substrate 20, and the conductive bumps 220 may be respectively attached on the substrate pads 110 by, e.g., a reflowing process, such that the semiconductor chips 200 may each be mounted on the substrate 20.

For example, after forming a seed layer on each chip pad 210 of each of the semiconductor chips 200, a plating process may be performed on the seed layer to sequentially form a lower bump portion and an upper bump portion on the seed layer. Accordingly, the conductive bump 220 may include the lower and upper bumps stacked on each other. The lower bump may include a first conductive material with a first ductility, and the upper bump may include a second conductive material with a second ductility different (for example, greater) than the first ductility. The first conductive material may include copper (Cu), nickel (Ni) or etc., and the second conductive material may include tin (Sn), tin/silver (Sn/Ag), tin/copper (Sn/Cu), tin/indium (Sn/In) or etc., though the present disclosure is not necessarily limited thereto.

The substrate 20 may be a printed circuit board (PCB) substrate. The substrate 20 may include a chip mounting region for mounting the plurality of semiconductor chips 200. The plurality of semiconductor chips 200 may be disposed on the chip mounting region.

Figure 7:
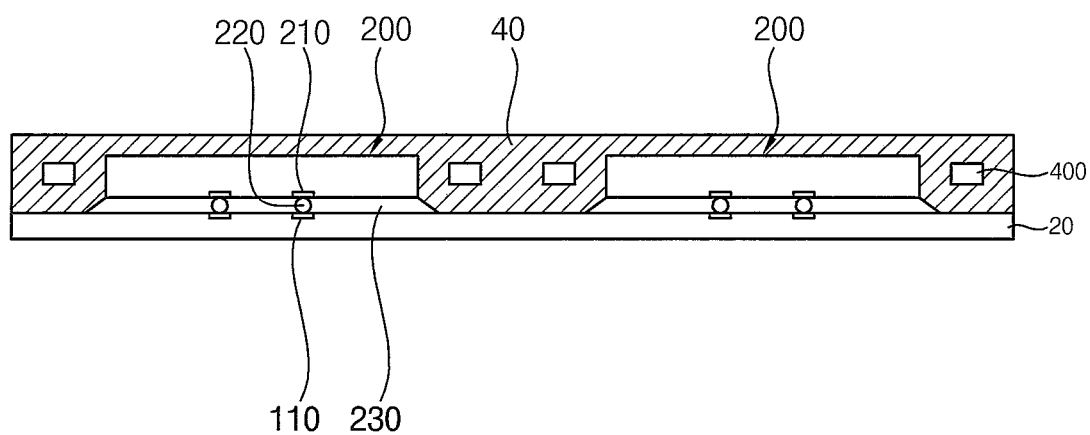

Referring to FIGS. 5 to 7, a molding material 40 may be formed on an upper surface of the substrate 20 to cover at least a portion of the semiconductor chips 200 and a mechanical reinforcing pattern 400 may be formed in the molding material 40.

As illustrated in FIGS. 5 and 6, a molding process may be performed using a molding apparatus 30. After disposing the substrate 20 in a cavity 35 between a lower mold 32 and an upper mold 34 of the molding apparatus 30, the reinforcing pattern 400 may be positioned around the semiconductor chip 200 in the cavity 35 during a state in which the lower and upper molds 32 and 34 are clamped together. Then, a molding material 40 may be injected into the cavity 35 and may be cured. For example, the molding material 40 may include an epoxy mold compound (EMC).

In particular, ejector pins 36 may be installed in at least one of the upper mold 34 and the lower mold 32 to dispose the mechanical reinforcing pattern 400 at a desired position within the cavity 35. The ejector pins 36 may be moved to protrude from a lower surface of the upper mold 34 to support or separate the mechanical reinforcing pattern 400 in the cavity 35.

The substrate 20 may be loaded on the lower mold 32 of the molding apparatus 30, and the mechanical reinforcing pattern 400 may be attached to and supported by the protruding ejector pins 36 and by an adhesive tape. When the lower mold 32 and the upper mold 34 are clamped with each other, the mechanical reinforcing pattern 400 may be positioned around the semiconductor chip 200 in the cavity 35. The adhesive tape may include a polymer tape serving as a temporary adhesive. When the molding material 40 is injected and cured, the adhesive tape may lose adhesion, and at this time, the ejector pins 36 may be returned to the inside of the upper mold 34.

Alternatively, the ejector pins 36 may support the mechanical reinforcing pattern 400 by vacuum adsorption. When the molding material 40 is injected and cured, the vacuum may be removed from the ejector pins 36, and at this time, the ejector pins 36 may be returned to the inside of the upper mold 34.

Then, after curing the molding material, the substrate 20 may be individually sawed, thereby manufacturing a plurality of flip chip packages.

Figure 8:
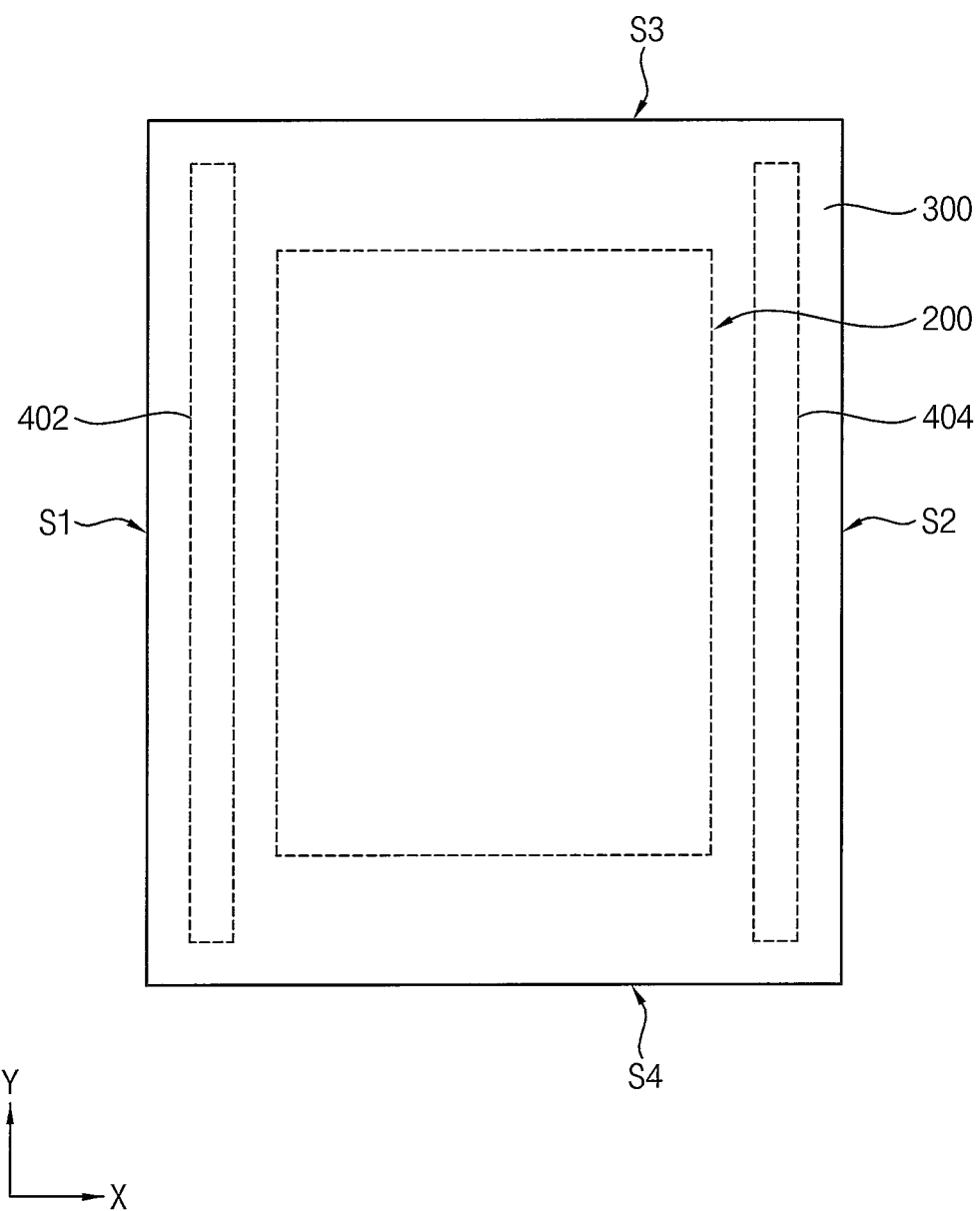
Figure 9:
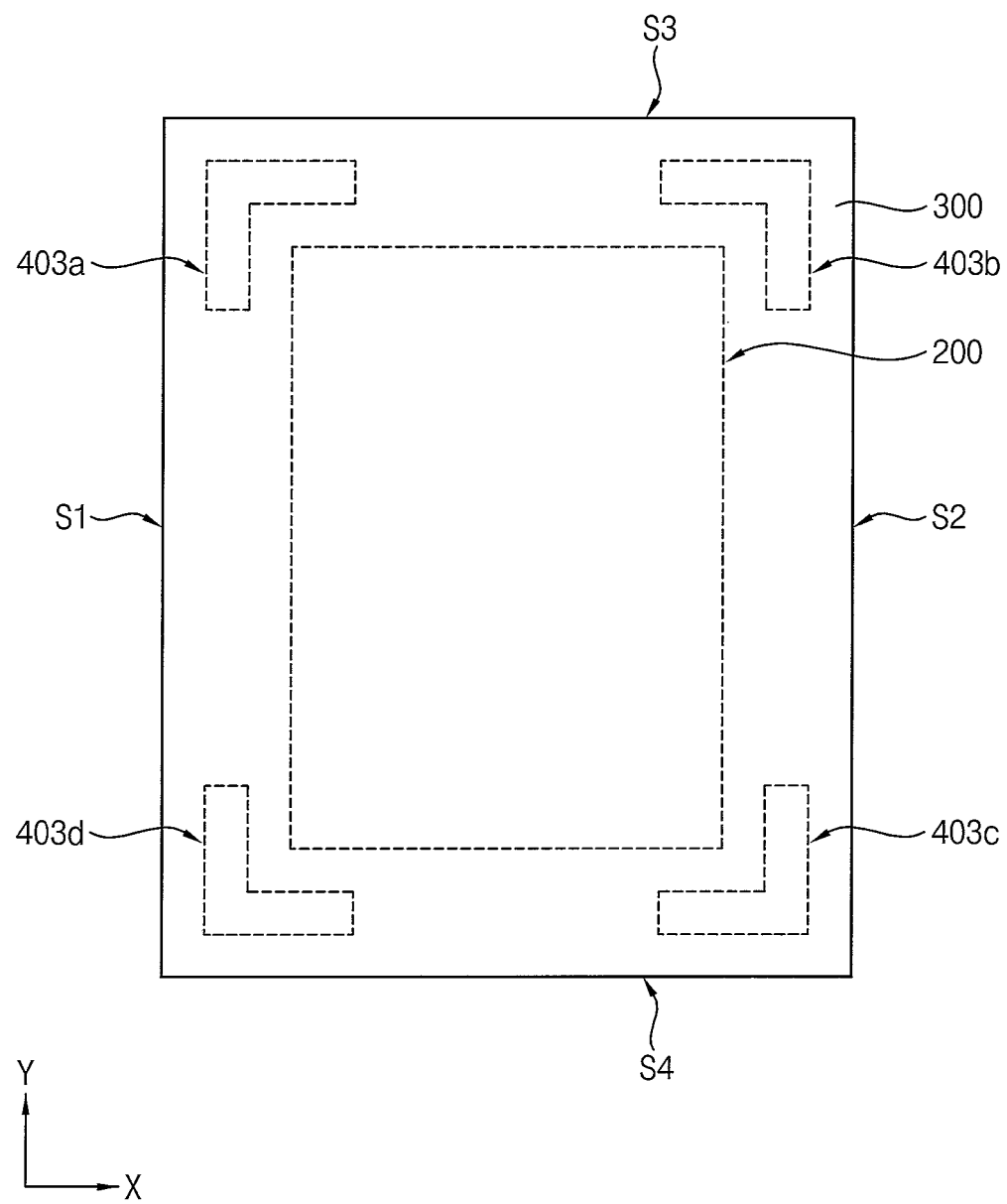
Figure 10:
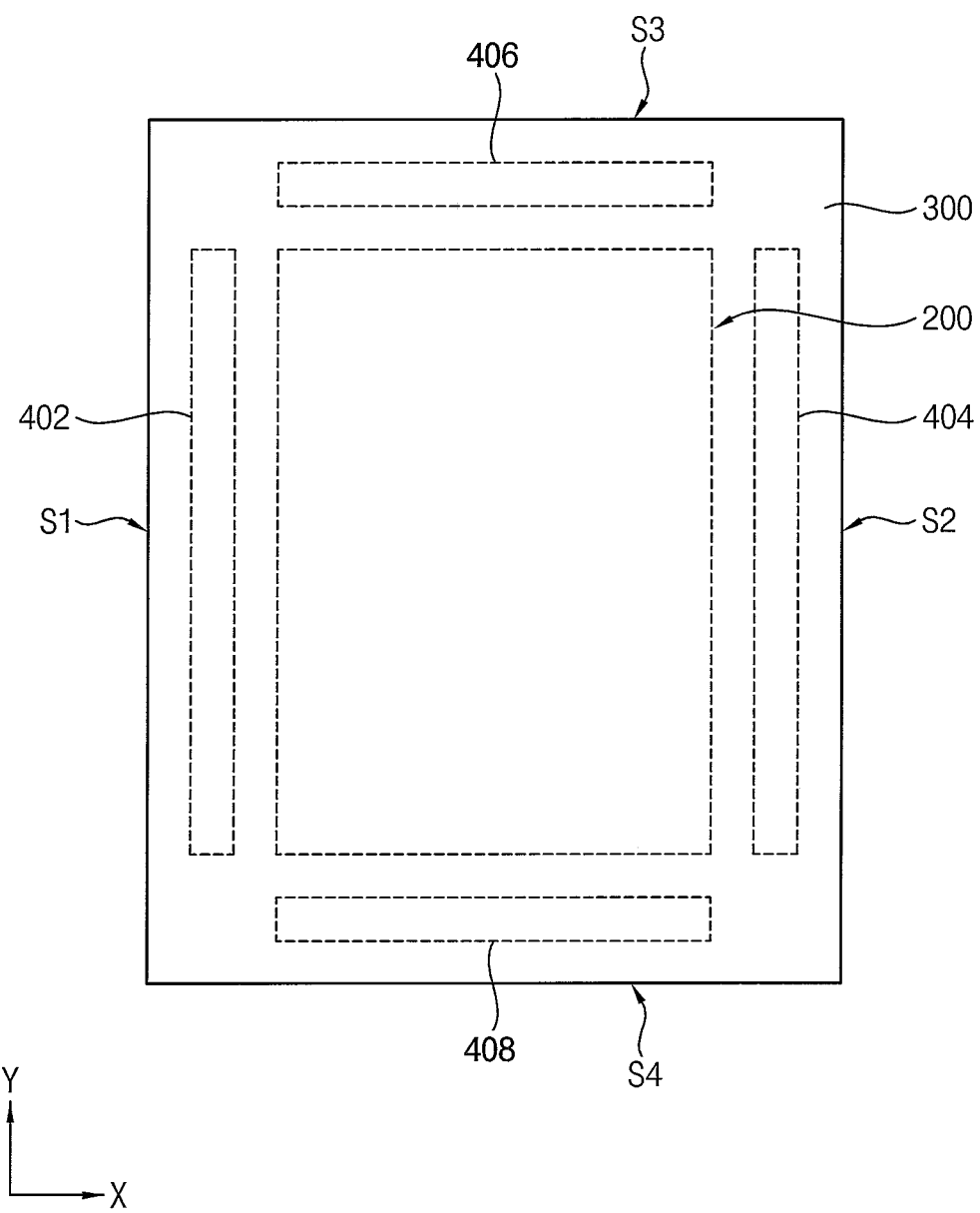

FIGS. 8 to 10 are plan views illustrating a reinforcing member in accordance with example embodiments.

Referring to FIG. 8, a reinforcing pattern may include a pair of support patterns 402 and 404 that are formed in both sides of a semiconductor chip 200 respectively. A first support pattern 402 may extend in a first direction (Y direction) along a first side surface S1 of a molding member 300. A second support pattern 404 may extend in the first direction (Y direction) along a second side surface S2 of the molding member 300 opposite to the first side surface S1. The first support pattern 402 may be spaced apart from the first side S1 of the first semiconductor chip 200. The second support pattern 404 may be spaced apart from the second side S2 of the semiconductor chip 200.

Referring to FIG. 9, a reinforcing pattern may include a plurality of support patterns 403a, 403b, 403c, 403d that may be formed around edges of a semiconductor chip 200. A first support pattern 403a may be formed around a first edge of the semiconductor chip 200, a second support pattern 403b may be formed around a second edge of the semiconductor chip 200, a third support pattern 403c may be formed around a third edge of the semiconductor chip 200 and a fourth support pattern 403c may be formed around a fourth edge of the semiconductor chip 200.

Referring to FIG. 10, a reinforcing pattern may include a plurality of support patterns 402, 404, 406, 408 that are provided around a semiconductor chip 200 and that may be spaced apart from each other. A first support pattern 402 may extend along a first side surface S1 of a molding member 300. A second support pattern 404 may extend along a second side surface S2 of the molding member 300 opposite to the first side surface S2. A third support pattern 406 may extend along a third side surface S3 of the molding member 300 adjacent to the first side surface. A fourth support pattern 408 may extend along a fourth side surface S4 of the molding member 300 opposite to the third side surface.

Figure 11:
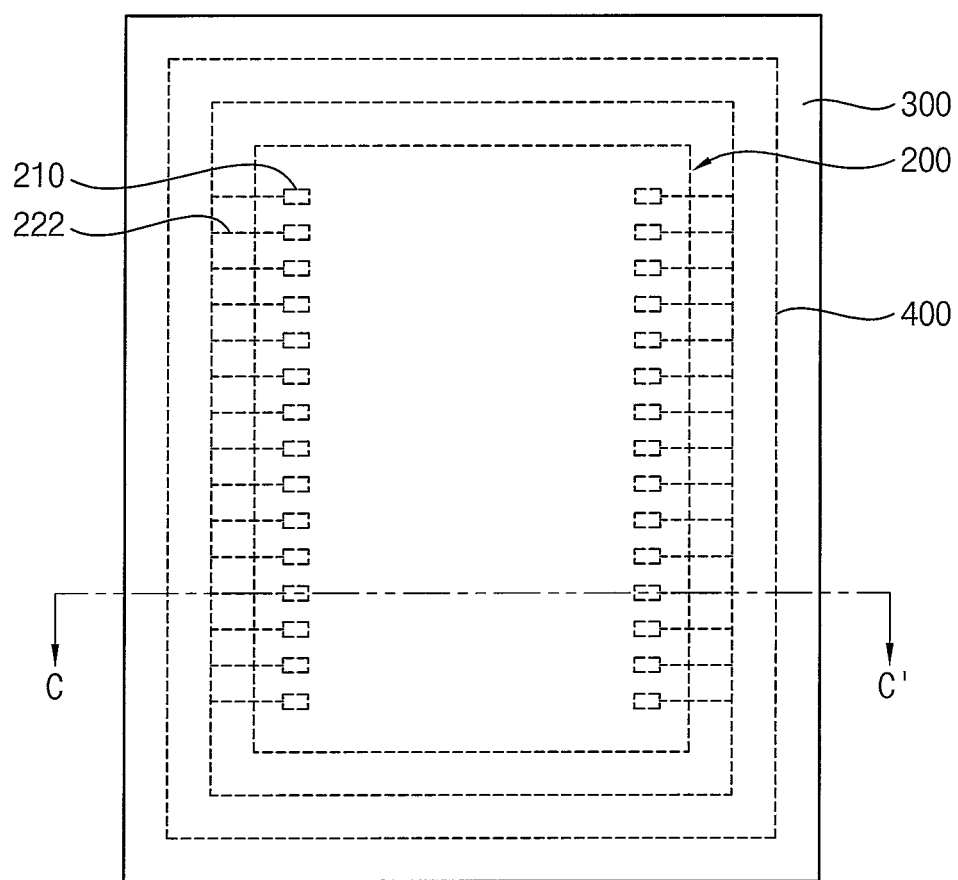
Figure 12:
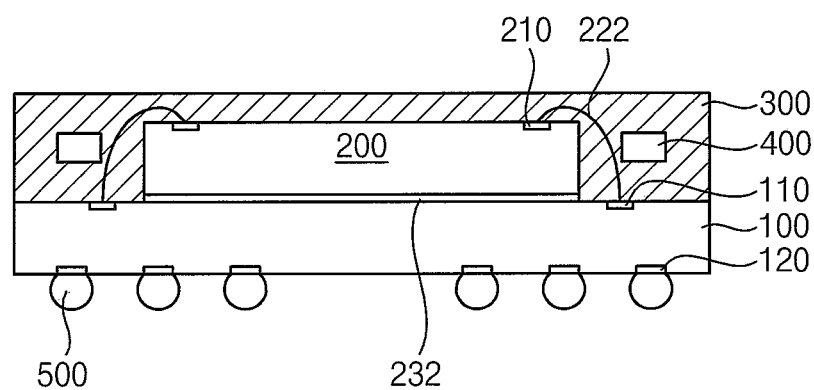

FIG. 11 is a plan view illustrating a semiconductor package in accordance with example embodiments. FIG. 12 is a cross-sectional view taken along the line C-C' in FIG. 11. The semiconductor package may be substantially the same as or similar to the semiconductor package described with reference to FIGS. 1 to 3 except for a mounting manner of a semiconductor chip. Thus, same reference numerals will be used to refer to the same or like elements and any further repetitive explanation concerning the above elements will be omitted.

Referring to FIGS. 11 and 12, a semiconductor chip 200 of a semiconductor package 11 may be mounted on a package substrate 100 in a wire bonding manner.

In example embodiments, the semiconductor chip 200 may be adhered on the package substrate 100 by an adhesive member 232. Chip pads 210 may be formed or disposed on a first surface of the semiconductor chip 200. The semiconductor chip 200 may be adhered on the package substrate 100 such that a second surface opposite to the first surface faces the package substrate 100. The adhesive member 232 may include epoxy, polyimide, etc. The adhesive member 232 may include an adhesive film such as DAF (direct adhesive film).

The chip pads 210 of the semiconductor chip 200 may be electrically connected to substrate pads 110 of the package substrate 100. A bonding wire 222 may include a conductive material, such as gold or aluminum.

In example embodiments, a molding member 300 may be provided on the package substrate 100 to cover at least a portion of the semiconductor chip 200 and the bonding wires 222. A reinforcing pattern 400 may be provided within the molding member 300 to extend around the semiconductor chip 200. A portion of the reinforcing pattern 400 may extend in one direction (Y direction) along the bonding wires 222. The reinforcing pattern 400 may be arranged outside the bonding wires 222.

Hereinafter, a method of manufacturing the semiconductor package in FIG. 11 will be described.

Figure 13:
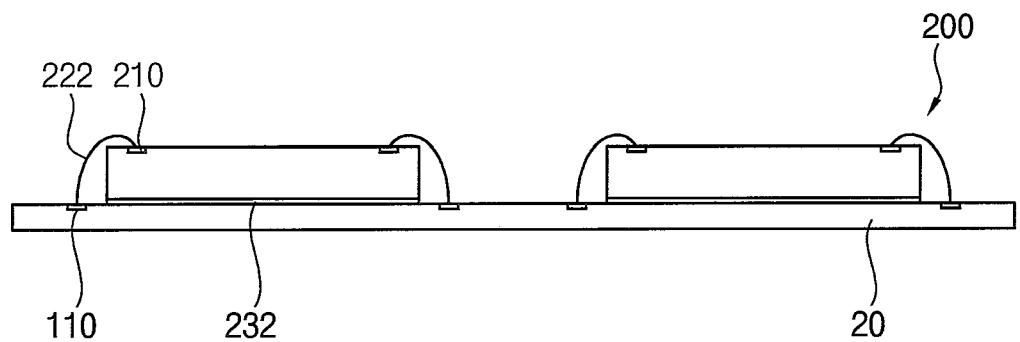
Figure 14:
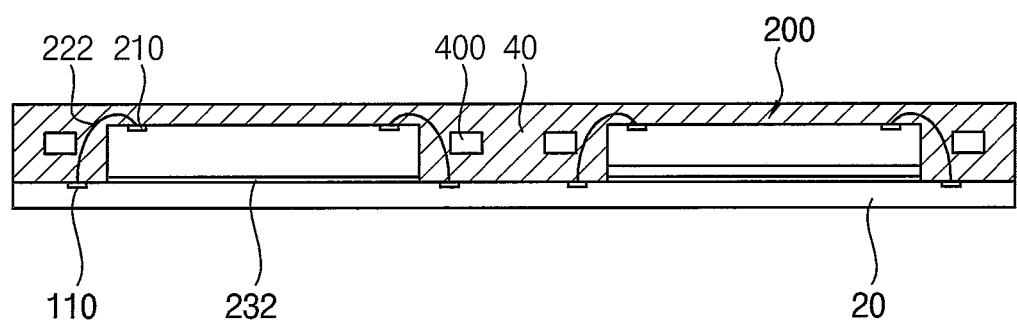

FIGS. 13 and 14 are cross-sectional views illustrating a method of manufacturing a semiconductor package in accordance with example embodiments.

Referring to FIG. 13, a plurality of semiconductor chips 200 may be arranged on a substrate 20.

In example embodiments, the semiconductor chips 200 may be mounted on the substrate 20 by a wire bonding process.

For example, the semiconductor chips 200 may be adhered on an upper surface of the substrate 20 using adhesive members 232. For example, the adhesive member may include an adhesive film such as DAF (direct adhesive film).

A wire bonding process may be performed to electrically connect the semiconductor chip 200 to the substrate 20. Chip pads 210 of the semiconductor chip 200 may be electrically connected to substrate pads 110 on the upper surface of the substrate 20 by the wire bonding process. For example, the chip pads 210 of the semiconductor chip 200 may be electrically connected to substrate pads 110 by bonding wires 222.

Referring to FIG. 14, a molding material 40 may be formed on the upper surface of the substrate 20 to cover at least a portion of the semiconductor chips 200 and a mechanical reinforcing pattern 400 may be formed within the molding material 40.

Processes the same as or similar to the processes described with reference to FIGS. 5 and 6 may be performed to form the molding material 40 on the substrate 20 to cover at least a portion of the semiconductor chips 200 and the mechanical reinforcing pattern 400 within the molding material 40 to extend around the semiconductor chip 200.

Then, the substrate 20 may be individually sawed, thereby manufacturing a plurality of semiconductor chip packages.

The semiconductor package may include semiconductor devices such as logic devices or memory devices. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as disclosed.

What is claimed is:

1. A method of manufacturing a semiconductor package, the method comprising:
   disposing a semiconductor chip on a substrate;
   disposing the substrate in a cavity between a lower mold and an upper mold of a molding apparatus;
   after disposing the substrate in the cavity, a mechanical reinforcing pattern around the semiconductor chip within the cavity such that the mechanical reinforcing pattern is suspended at a predetermined height from the substrate;
   injecting a molding material into the cavity; and
   curing the molding material within the cavity.

2. The method of claim 1, wherein positioning the mechanical reinforcing pattern within the cavity comprises:
supporting the mechanical reinforcing pattern in the cavity using ejector pins that are installed in at least one of the upper mold and the lower mold.

3. The method of claim 2, wherein the mechanical reinforcing pattern is supported on the ejector pins by an adhesive tape.

4. The method of claim 2, further comprising:
moving the ejector pins to protruding from a surface of the at least one of the upper mold and the lower mold; and
returning the ejector pins to an inside of the at least one of the upper mold and the lower mold when the molding material is cured.

5. The method of claim 1, wherein the cured the molding material covers upper and lower sides of the mechanical reinforcing pattern.

6. The method of claim 1, further comprising:
after curing the molding material, sawing the substrate into an individual semiconductor package.

7. The method of claim 1, wherein arranging the semiconductor chip on the substrate is performed by a flip chip bonding process.

8. The method of claim 7, wherein performing the flip chip bonding process includes mounting the semiconductor chip on the substrate using conductive bumps that are respectively attached on substrate pads of the substrate.

9. The method of claim 1, wherein arranging the semiconductor chip on the substrate is performed by a wire bonding process.

10. The method of claim 1, wherein performing the wire bonding process includes:
adhering the semiconductor chip on the substrate by an adhesive member; and
electrically connecting chip pads of the semiconductor chip to substrate pads of the substrate by bonding wires, respectively.

11. A method of manufacturing a semiconductor package, the method comprising:
disposing a semiconductor chip on a substrate;
after disposing the semiconductor chip on the substrate, positioning a mechanical reinforcing pattern around the semiconductor chip, the mechanical reinforcing pattern to be suspended at a predetermined height from the substrate; and
forming a molding material on the substrate to cover at least a portion of the semiconductor chip and upper and lower sides of the mechanical reinforcing pattern.

12. The method of claim 11, wherein positioning the mechanical reinforcing pattern around the semiconductor chip comprises
disposing the substrate in a cavity between a lower mold and an upper mold of a molding apparatus; and
supporting the mechanical reinforcing pattern in the cavity using ejector pins that are installed in at least one of the upper mold and the lower mold.

13. The method of claim 12, wherein the mechanical reinforcing pattern is supported on the ejector pins by an adhesive tape.

14. The method of claim 12, further comprising:
moving the ejector pins to protruding from a surface of the at least one of the upper mold and the lower mold; and
returning the ejector pins to an inside of the at least one of the upper mold and the lower mold when the molding material is formed.

15. The method of claim 12, wherein forming a molding material on the substrate comprises:
injecting the molding material into the cavity; and
curing the molding material within the cavity.

16. The method of claim 11, further comprising:
after forming the molding material, sawing the substrate and the molding material into an individual semiconductor package.

17. The method of claim 11, wherein the molding material has a first tensile strength, and wherein the mechanical reinforcing pattern has a second tensile strength greater than the first tensile strength.

18. The method of claim 11, wherein the molding material has a first coefficient of thermal expansion, and wherein the mechanical reinforcing pattern has a second coefficient of thermal expansion different from the first coefficient of thermal expansion.

19. The method of claim 11, wherein the mechanical reinforcing pattern has a ring shape extending around the semiconductor chip.

20. The method of claim 11, wherein the mechanical reinforcing pattern includes a plurality of support patterns disposed around the semiconductor chip, and wherein the plurality of support patterns are spaced apart from each other.

* * * * *